(12) United States Patent
Lee et al.

(10) Patent No.: US 7,821,127 B2
(45) Date of Patent: Oct. 26, 2010

(54) SEMICONDUCTOR DEVICE PACKAGE HAVING BUFFERED MEMORY MODULE AND METHOD THEREOF

(75) Inventors: Jong-Joo Lee, Suwon-si (KR); Young-Hee Song, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1250 days.

(21) Appl. No.: 11/033,845

(22) Filed: Jan. 13, 2005

(65) Prior Publication Data

US 2005/0224948 A1 Oct. 13, 2005

(30) Foreign Application Priority Data

Apr. 8, 2004 (KR) .................... 10-2004-0024019

(51) Int. Cl.
*H01L 23/34* (2006.01)
(52) U.S. Cl. .................. 257/723; 257/686; 257/777; 257/E25.01; 438/107; 438/109; 438/110
(58) Field of Classification Search .......... 257/686, 257/692, 697, 723, 777
See application file for complete search history.

(56) References Cited

U.S. PATENT DOCUMENTS

| | | | |
|---|---|---|---|
| 5,099,309 A * | 3/1992 | Kryzaniwsky | 361/718 |
| 5,517,057 A | 5/1996 | Beilstein, Jr. et al. | |
| 6,597,062 B1 * | 7/2003 | Li et al. | 257/686 |
| 6,717,275 B2 * | 4/2004 | Matsuura et al. | 257/778 |
| 2002/0030261 A1 * | 3/2002 | Rolda et al. | 257/685 |
| 2003/0199119 A1 * | 10/2003 | Lin | 438/107 |

FOREIGN PATENT DOCUMENTS

| | | |
|---|---|---|
| JP | 10-284683 | 10/1998 |
| KR | 2002-0095061 | 12/2002 |
| KR | 2003-0036130 | 5/2003 |

* cited by examiner

*Primary Examiner*—Thao X Le
*Assistant Examiner*—Ajay K. Arora
(74) *Attorney, Agent, or Firm*—Harness, Dickey & Pierce, P.L.C.

(57) ABSTRACT

A method and apparatus of fabricating a semiconductor device are disclosed. The semiconductor device may include a buffer chip package having a buffer chip mounted on a buffer chip substrate and at least one memory package mounted on the buffer chip substrate, wherein the at least one memory package may include a plurality of memory chips. Further, the buffer chip package may have a plurality of external connection terminals.

20 Claims, 12 Drawing Sheets

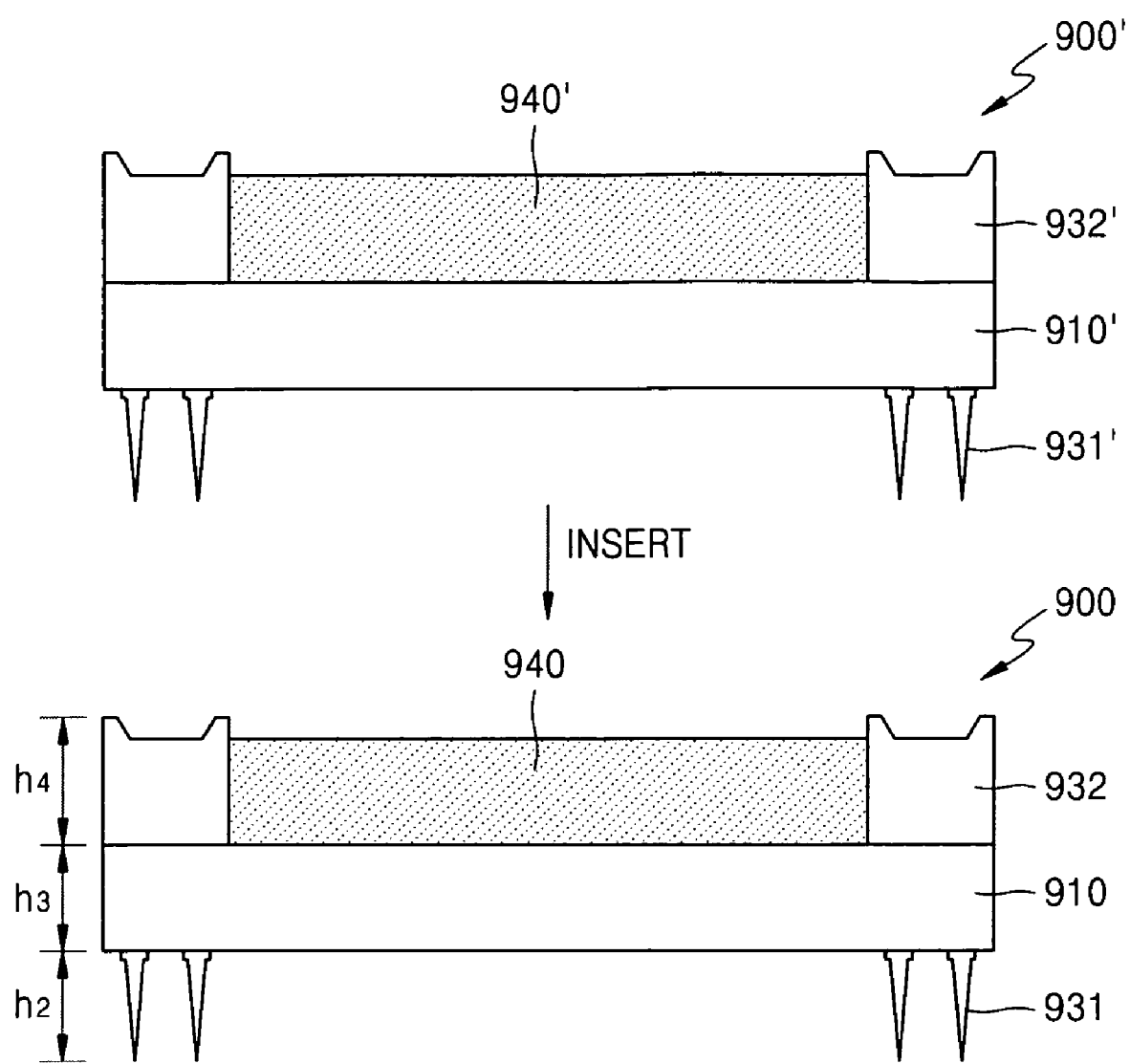

US 7,821,127 B2

SEMICONDUCTOR DEVICE PACKAGE HAVING BUFFERED MEMORY MODULE AND METHOD THEREOF

BACKGROUND OF THE INVENTION

This U.S. non-provisional application claims priority under 35 U.S.C. §119 to Korean Patent Application No. 2004-24019, filed on Apr. 8, 2004, in the Korean Intellectual Property Office, the contents of which are incorporated by reference herein in their entirety.

FIELD OF THE INVENTION

The present invention relates to a semiconductor device package, and more particularly, to a semiconductor device package with at least one buffered memory module.

DESCRIPTION OF THE RELATED ART

A computer system may generally include a plurality of memory modules and at least one integrated circuit chipset (IC chipset) connected to the memory modules. The memory modules and the IC chipset may be connected using a memory interface which may transmit communication between them. As today's computer systems desire to improve performance, perform multi-tasking, and/or operate at higher speeds, the memory capacity may have to increase. Accordingly, configurations of the memory interface between the memory modules and IC chipset may need to improve so that a large capacity memory may communicate at high speed with the IC chipset.

A computer system having large memory capacity and/or high speed may have an IC chipset with an increased operating frequency and/or a large number of memory modules connected to the IC chipset. In conventional computer systems, each memory module may provide only a direct connection to channels of a system board connected on the IC chipset. However, system channels may limit the transfer speed when supporting high speed operation. That is, the system channels may not provide a higher Giga-Transfer-Per-Second (GTPS) or transfer speed.

Further, computer systems that may include a large capacity Dynamic Random Access Memory (DRAM) module may operate at a high speed if a buffer is included in a memory interface (hereinafter, a buffered memory module). When a memory buffer is included in the memory interface, a point-to-point signal scheme between the memory chips and the IC chipset constituting the buffered memory module may be provided. Accordingly, the operating speed of the computer system may be improved by including a buffered memory module that supports higher transfer speed.

FIG. 1 is a schematic diagram illustrating a conventional point-to-point signal scheme of a computer system that may include an IC chipset and a plurality of buffered DRAM modules (e.g., first buffered DRAM module 200a, second buffered DRAM module 200b, third buffered DRAM module 200c, and fourth buffered DRAM module 200d). The plurality of DRAM modules 200a-200d may also be a fully buffered dual-inline-memory-modules (BDIMMs), indicated as (e.g., a first BDIMM 200a, a second BDIMM 200b, a third BDIMM 200c, and a fourth BDIMM 200d).

Referring to FIG. 1, the first BDIMM 200a may include a first buffer 210a and a group of first DRAMs 220a. The second BDIMM 200b may include a second buffer 210b and a group of second DRAMs 220b. The third BDIMM 200c may include a third buffer 210c and a group of third DRAMs 220c. The fourth BDIMM 200d may include a fourth buffer 210d and a group of fourth DRAMs 220d. To obtain a point-to-point signal scheme in the computer system, the first buffer 210a may act as a communication relay station between a chipset 100 and the first group of DRAMs 220a and between the chipset 100 and the second buffer 210b. The second buffer 210b may act as a communication relay station between the first buffer 210a and the second group of DRAMs 220b and between the first buffer 210a and the third buffer 210c. The third buffer 210c may act as a communication relay station between the second buffer 210b and the third group of DRAMs 220c and between the second buffer 210b and the fourth buffer 210d. The fourth buffer 210d may act as a communication relay station between the third buffer 210c and the fourth group of DRAMs 220d. In other words, the first buffer 210a may be electrically connected with the chipset 100, each of the first group of DRAMs 220a, and the second buffer 210b. Accordingly, each of the second through fourth buffers 200b through 200d may be electrically connected with its corresponding DRAMs 220b, 220c or 220d and its adjacent buffers.

FIG. 2 is a plan view of a conventional BDIMM package 300. The BDIMM package 300 of FIG. 2 may be a package of one of the BDIMMs 200a through 200d in FIG. 1 formed on a module substrate 302.

Referring to FIG. 2, the BDIMM package 300 may include a module substrate 302, connector pins 304, a buffer chip package 310, and a group of DRAM packages 320. The group of the DRAM packages 320 may include, for example, four (4) DRAM chips, eight (8) DRAM chips (9 DRAM chips when an error correction code (ECC) is included), or sixteen (16) DRAM chips (18 DRAM chips when two ECCs are included). In FIG. 2, the BDIMM package 300 may include 18 DRAM chips. In this exemplary embodiment, eight DRAM packages including two ECC packages (hereinafter, DRAM packages) may be mounted on a front surface of the module substrate 302, and ten DRAM packages may be mounted on a back surface of the module substrate 302. The first BDIMM 200a will now be described.

Referring to FIG. 2, connection terminals (not shown) may be formed on a front and a back surface of the module substrate 302. Connection terminals for the DRAM packages 320 and connection terminals for the buffer package 310 may be formed on the front surface of the module substrate 302. Alternatively, connection terminals for the DRAM packages 320 may be formed on the back surface of the module substrate 302. A plurality of metal wiring patterns (not shown) may be formed in the module substrate 302. The metal wiring patterns may include at least a DRAM connection metal wiring pattern (hereinafter, a memory connection wiring) and an external connection metal wiring pattern (hereinafter, an external connection wiring). The memory connection wiring may electrically connect the connection terminals for the DRAM packages 320 with the connection terminals for the buffer package 310. The external connection wiring may electrically connect the connection terminals for the buffer packages 310 with the connection terminals for connector pins 304.

As shown in FIG. 2, a height h1 of the module substrate 302 may be approximately 3-3.5 cm depending on the sizes of the buffer package 310 and the connector 304, and a length $l_1$ of the module substrate 302 may be approximately greater than 15 cm. The module substrate 302 may be mounted onto the system board by inserting the connector pins 304 to the system board. Therefore, the computer system that may include the BDIMM package 300 having the above configuration should have a height of approximately 3-3.5 cm and a length of approximately greater than 15 cm.

Referring to FIG. 2, the connector pins 304 may be formed on one or both sides of the module substrate 302. The connector pins 304 may be inserted into the system board and may act as the external connection terminals of the module substrate 302. As described above, the connector pins 304 may be connected to the external connection wirings. Therefore, the connector pins 304 may include first connector pins that may be electrically connected to the chipset 100, and the second connector pins that may be electrically connected to the second buffer 210b.

The buffer package 310 may be mounted on the module substrate 302. The buffer package 310 may include a buffer chip 314, a substrate 312 for the buffer chip 314 (hereinafter, a buffer chip substrate), and external connection terminals (not shown). The buffer chip 314 may include bumps (not shown) for electrically connecting to the buffer chip substrate 312.

The buffer chip substrate 312 may include connection terminals (not shown) connected to the bumps and a metal wiring pattern (not shown) formed within the buffer chip substrate 312. The metal wiring pattern may electrically connect the connection terminals of the buffer chip substrate 312 to the external connection terminals of the buffer package 310. For example, a ball grid array (BGA) package or a pin grid array (PGA) package which may include a relatively large number of external connection terminals may be commonly used because of the external connection terminals. In other words, solder balls or pins, for example, of the buffer package 310 may be electrically connected to all of the memory connection wirings and external connection wirings of the buffer chip substrate 312 via the external connection terminals of the buffer package 310.

However, due to a large number of connection terminals for the buffer package 310, this may increase the overall volume of the BDIMM package 300. Moreover, the size of the buffer chip substrate 312 may be greater than a size of the buffer chip 314 because of the number of solder balls or pins, which may also increase the overall volume of the BDIMM package 300.

Moreover, the metal wiring pattern of the buffer package 310 that may electrically connect the bumps of the buffer chip 314 to the external connection terminals of the buffer chip substrate 312 may complicate the design of the semiconductor device due to high wiring density. Therefore, an additional expensive build-up substrate may be used as the buffer chip substrate 312. The build-up substrate may include a core layer in which a plurality of through holes may be formed. However, many through holes may have to be formed in the core layer because the metal wiring pattern of the buffer package may be complicated due to the high wiring density. Accordingly, this may increase the difficulty of forming the buffer chip substrate 312 and difficulty in securing the electrical characteristics of the package that uses the build-up substrate. Therefore, the reliability and performance of the substrate may be reduced.

As described above, the BDIMM package 300 may be, for example, a rectangular shape with the designated height $h_1$ and length $l_1$. However, the BDIMM package 300 with the rectangular shape may provide a disadvantage because it may be difficult to obtain a uniform wiring length from each of the DRAM packages 320 to the buffer package 310. Further, the length of some of the wirings may be long as the location of the DRAM package 320 in relation to the buffer package 310 may also be long. For example, the DRAM package 320 located at an outermost edge of the BDIMM package 300 may include a relatively longer wiring than the DRAM package 320 located nearer to the buffer package 310. Therefore, the length of each of the wirings for the DRAM packages 320 may have to be set based on the longest wiring. When the length of the wiring is increased, electrical characteristics of the wiring may become degraded (e.g., the resistance may increase in the wiring). Further, the length of the metal connection wirings for addressing/commanding in the module substrate 302 may produce different characteristics due to the difference in the length of the wirings. As a result, controlling a signal timing budget for each of the DRAM packages may be difficult because the length of the metal connection wiring and electrical characteristics may be different according to the location of the DRAM package 320.

Also, when configuring a computer system that may include a plurality of DRAM modules 320 by inserting a plurality of the BDIMM packages 300 in the system board, the area of the system board may be increased due to the number of the BDIMM packages 300. This may be because the BDIMM packages 300 with given volumes may be inserted into the system board. That is, the expansion capacity of the computer system that may include a BDIMM module may increase with an increase in the area of the system board. Therefore, manufacturing a small computer that may include a high capacity of DRAM module using the conventional technology may be difficult to manufacture.

SUMMARY OF THE INVENTION

Exemplary embodiments of the present invention may provide a semiconductor device having at least a buffer chip package that may include a buffer chip mounted on a buffer chip substrate, the buffer chip package may include a plurality of external connection terminals, and at least one memory package mounted on the buffer chip substrate, the at least one memory package may include a plurality of memory chips.

In other exemplary embodiments, the external connection terminals may be one of solder balls and pins.

In other exemplary embodiments, the pins may be one of a ball grid array package and a pin grid array package.

In other exemplary embodiments, the buffer chip may be mounted on a surface of the buffer chip substrate on the same surface on which the external connection terminals are disposed.

In yet other exemplary embodiments, the buffer chip may be mounted on a surface of the buffer chip substrate opposite from a surface on which the external connection terminals are disposed.

In another exemplary embodiments, the semiconductor device may include at least a buffer chip substrate that may include buffer connection terminals and memory connection terminals, a buffer chip mounted on the buffer chip substrate and electrically connected to the buffer connection terminals, a plurality of memory packages mounted on the buffer chip substrate and electrically connected to the memory connection terminals, and a plurality of external connection terminals formed on a lower surface of the buffer chip substrate.

In other exemplary embodiments, the plurality of memory packages may be mounted on an upper surface of the buffer chip substrate.

In other exemplary embodiments, each of the memory packages may be one of a single chip package and a chip-stacked package.

In other exemplary embodiments, the buffer chip may be mounted in a flip-chip type.

In other exemplary embodiments, the present invention may include a plurality of decoupling capacitors disposed on the buffer chip substrate.

In other exemplary embodiments, the buffer chip substrate may include a plurality of memory connection wirings that electrically connect a portion of the buffer connection terminals with the memory connection terminals, and a plurality of external connection wirings that electrically connect the remaining portion of the buffer connection terminals with the external connection terminals of the memory module.

In other exemplary embodiments, the memory connection wirings may be formed on an upper surface of the buffer chip substrate.

In yet other exemplary embodiments, the buffer chip substrate may be a build-up substrate that may include a core layer in which a plurality of through holes are formed, and the external connection wirings may pass through the core layer and the memory connection wirings may not pass through the core layer.

In other exemplary embodiments, the external connection wirings may be formed on a lower surface of the buffer chip substrate.

In yet other exemplary embodiments, the buffer chip substrate may be a build-up substrate that may include a core layer in which a plurality of through holes are formed, and the memory connection wirings pass through the core layer and the external connection wirings may not pass through the core layer.

In another exemplary embodiments, a buffered memory module stack package may be provided having a first buffered memory module package, and a second buffered memory module package stacked on the first buffered memory module package, wherein each of the first and second buffered memory module packages may include at least a buffer chip substrate that may include buffer connection terminals, memory connection terminals, and wire connection pads, a buffer chip mounted on the buffer chip substrate so as to be electrically connected to the memory connection terminals, a plurality of memory packages mounted on the buffer chip substrate so as to be electrically connected to the memory connection terminals, a plurality of first external connection terminals formed on a lower surface of the buffer chip substrate, and a plurality of second external connection terminals formed on an upper surface of the buffer chip substrate so as to be electrically connected to the wire connection pads.

In other exemplary embodiments, the first external connection terminals of the first buffered memory module package may be pin terminals and solder ball terminals.

In yet other exemplary embodiments, the second external connection terminals may be socket terminals, and the first external connection terminals of the second buffered memory module package may be inserted into the second external connection terminals of the first buffered memory module package.

In other exemplary embodiments, the memory chips or the memory packages may be mounted on an upper surface of the buffer chip substrate, the buffer chip may be mounted on one of a lower surface and an upper surface of the buffer chip substrate, and the second external connection terminals may be located outside of the memory chips or the memory packages on an upper surface of the buffer chip substrate.

In other exemplary embodiments, each of the memory packages may be one of a single chip package and a chip-stacked package.

In other exemplary embodiments, the buffered memory module stack package may further include a plurality of decoupling capacitors disposed on the buffer chip substrate.

In other exemplary embodiments, the buffer chip substrate may further include a plurality of memory connection wirings that electrically connect a portion of the buffer connection terminals with the memory connection terminals, a plurality of first external connection wirings that electrically connect another portion of the buffer connection terminals with the first external connection terminals of the buffered memory module package, and a plurality of second external connection wirings that electrically connect still another portion of the buffer connection terminals with the wire connection pads of the buffered memory module package.

In other exemplary embodiments, the memory connection wirings and the second external connection wirings may be formed on an upper surface of the buffer chip substrate.

In other exemplary embodiments, the buffer chip substrate may be a build-up substrate that may include a core layer in which a plurality of through holes may be formed, and first external connection wirings passing through the core layer, and the memory connection wirings and the second external connection wirings may not pass through the core layer.

In other exemplary embodiments, the first external connection wirings may be formed on a lower surface of the buffer chip substrate.

In yet other exemplary embodiments, the buffer chip substrate may be a build-up substrate that may include a core layer in which a plurality of through holes may be formed, and the memory connection wirings and the second external wirings may be passing through the core layer and the first external connection wirings may not pass through the core layer.

In yet other exemplary embodiments, the buffered memory module stack package may further include at least one buffered memory module package having identical configurations to the second buffered memory module package, mounted on an upper surface of the second buffered memory module package.

In other exemplary embodiment, a method for fabricating the semiconductor device is provided. The method may include mounting a buffer chip package on a buffer chip substrate, the buffer chip package includes a buffer chip, mounting at least one memory package on the buffer chip substrate, the at least one memory package includes a plurality of memory chips, and connecting a plurality of external connection terminals on the buffer chip substrate.

The exemplary embodiments of the present invention provides a buffered memory module package that may have an improved electrical characteristics due to uniform and reduced distances between a buffer and a plurality of DRAMs that constitute a DRAM module.

The exemplary embodiments of the present invention may also provide a buffered memory module package that may include a build-up package substrate that may have an increased electrical reliability. In other words, the difficulty in manufacturing the build-up package substrate may be reduced by reducing the density of metal wiring patterns that connect the upper and lower surfaces of the buffer chip substrate and reducing the number of external connection terminals of the buffer chip substrate.

The exemplary embodiments of the present invention also provide a buffered memory module package that may increase the memory capacity of a computer system that includes a plurality of buffered memory module packages. The buffered memory module package may also reduce the overall size of the computer system and improve the configuration efficiency of a system board.

BRIEF DESCRIPTION OF THE DRAWINGS

Exemplary embodiments of the present invention will be readily understood with reference to the following detailed description thereof provided in conjunction with the attached drawings in which:

FIG. 11 is a schematic drawing illustrating an exemplary embodiment of a configuration of a module stack package according to the present invention;

DETAILED DESCRIPTION OF THE EXEMPLARY EMBODIMENTS

Figure 1:
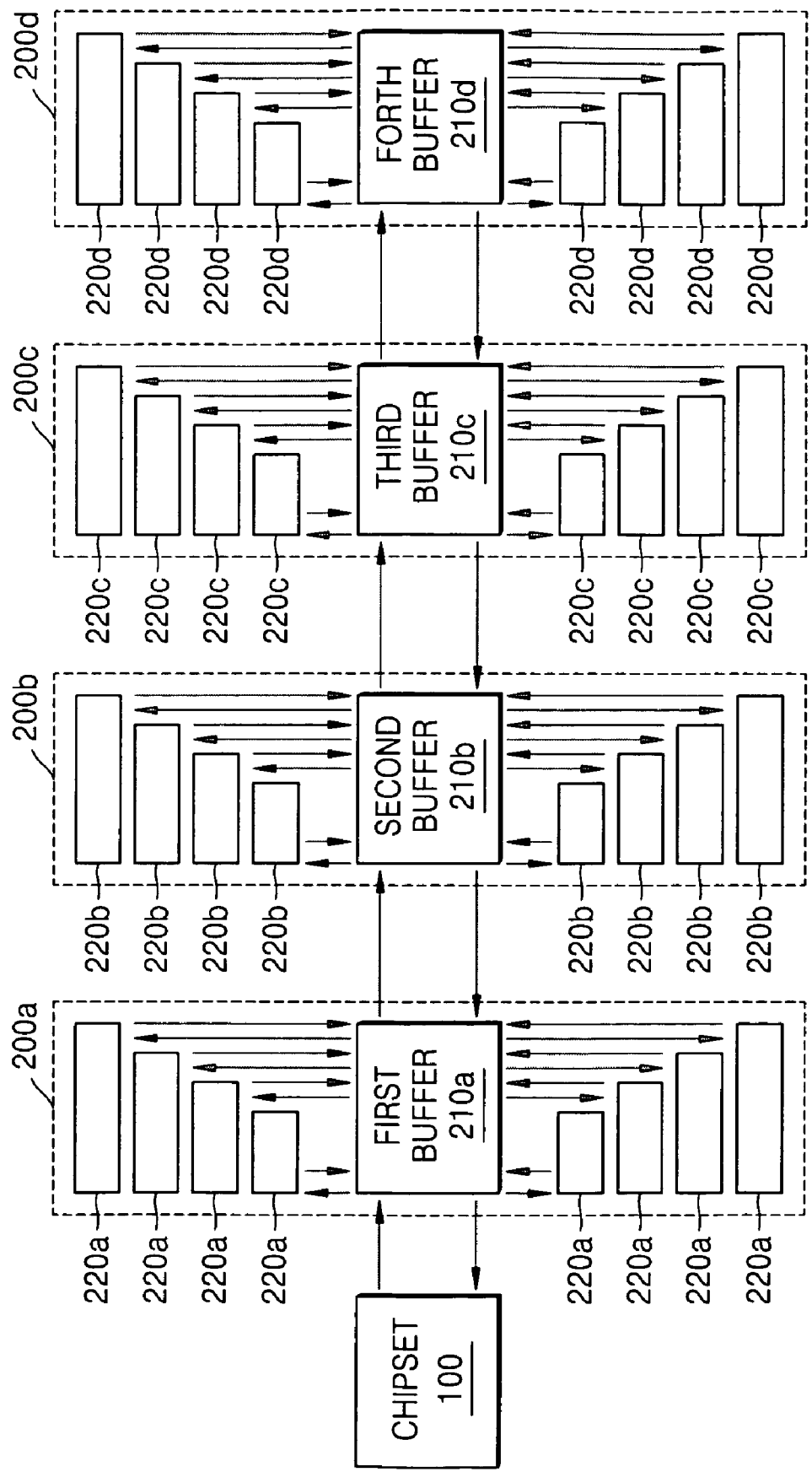
FIG. 1 is a schematic diagram illustrating a conventional point-to-point signal scheme of a computer system that includes an IC chipset and a plurality of buffered DRAM module.

The present invention will now be described more fully with reference to the accompanying drawings in which exemplary embodiments of the invention are shown.

It should be noted that these Figures are intended to illustrate the general characteristics of methods and devices of exemplary embodiments of this invention, for the purpose of the description of such exemplary embodiments herein. These drawings are not, however, to scale and may not precisely reflect the characteristics of any given embodiment, and should not be interpreted as defining or limiting the range of values or properties of exemplary embodiments within the scope of this invention.

In particular, the relative thicknesses and positioning of layers or regions may be reduced or exaggerated for clarity. Further, a layer is considered as being formed "on" another layer or a substrate when formed either directly on the referenced layer or the substrate or formed on other layers or patterns overlaying the referenced layer. Further, it should be understood that when a layer is referred to as being "on", "formed on" or "mounted on" another layer or substrate, the layer may be directly on the other layer or substrate, or intervening layer(s) may also be present. Like reference numerals refer to like elements throughout the drawings.

Exemplary embodiments of the present invention may provide a buffered memory module package having an improved electrical characteristic due to uniform and reduced distances between a buffer and a plurality of DRAMs that constitute a DRAM module.

Exemplary embodiments of the present invention may also provide a buffered memory module package including at least a build-up package substrate having an increased electrical reliability. Accordingly, the method of manufacturing the build-up package substrate may be uncomplicated by reducing the density of metal wiring patterns that connect the upper and lower surfaces of the buffer chip substrate and reducing the number of external connection terminals of the buffer chip substrate.

Figure 3:
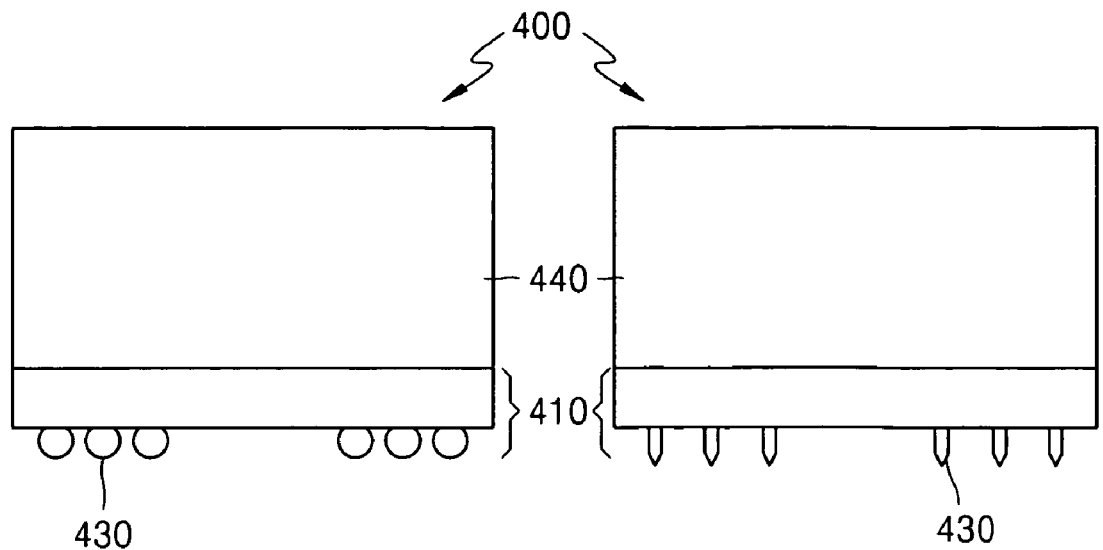
FIG. 3 is a schematic drawing illustrating an exemplary embodiment of a configuration of a buffered DRAM module package according to the present invention.

FIG. 3 is a schematic drawing illustrating an exemplary embodiment of a buffered memory module package according to the present invention.

Referring to FIG. 3, a buffered memory module package 400 may include at least a buffer package 410 and a plurality of memory packages 440 mounted on the buffer package 410. The buffered memory module package 400 may be mounted on a system board (not shown) with external connection terminals 430. The external connection terminals 430 may be, for example, solder balls (shown in left side in FIG. 3) or pins (shown in right side in FIG. 3). However, it should be appreciated that other types of connections terminals may be employed beside the solder balls and pins. In an exemplary embodiment, when mounting on a system board using solder balls, the buffered memory module package 400 may be directly mounted using a surface mounting method, for example, but not limited to, by soldering or using a socket, which may be typically employed in a burn-in process. In an alternative exemplary embodiment, when mounting on the system board using pins, the buffered memory module package 400 may be mounted using, for example, but not limited to, a socket for a pin grid array (PGA) or a ball grid array (BGA).

Figure 4A:
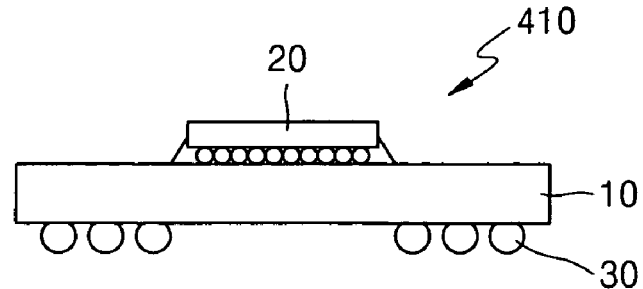
FIGS. 4A and 4B are side views of an exemplary embodiment of a buffered DRAM module packages according to the present invention.
Figure 4B:
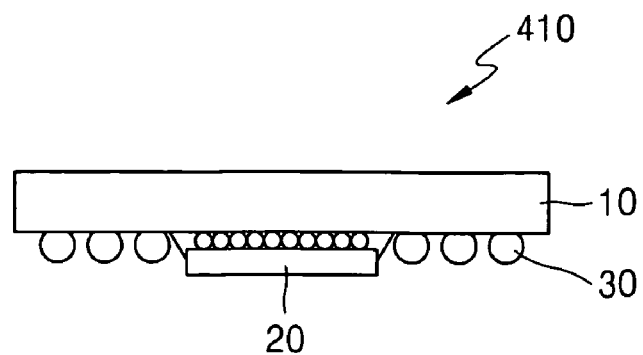

FIGS. 4A and 4B are schematic drawings illustrating exemplary embodiments of the buffer package 410 of FIG. 3.

Referring to FIGS. 4A and 4b, the buffer package 410 may include at least a substrate 10 for the buffer chip (hereinafter, a buffer chip substrate), a buffer chip 20, and external connection terminals 30.

Figure 2:
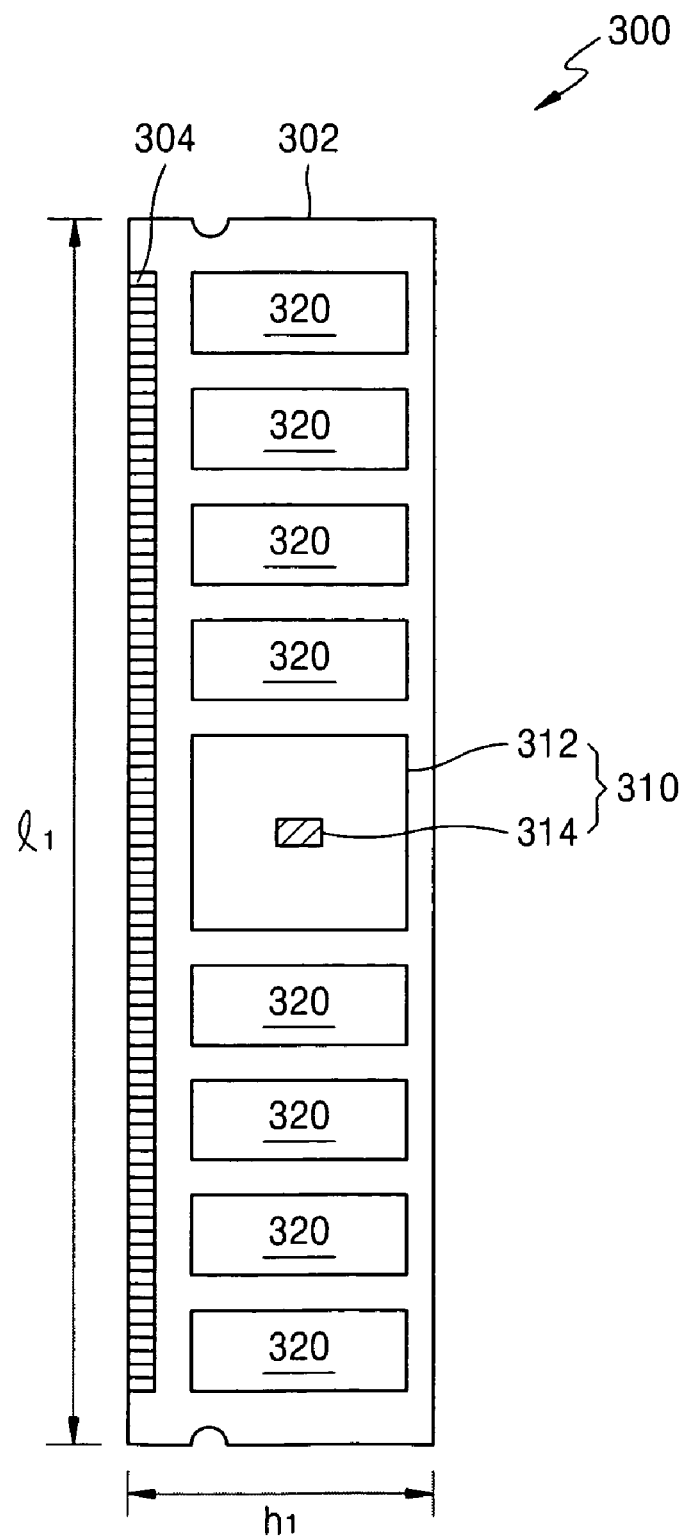
FIG. 2 is a plan view of a conventional buffered DRAM module package.

The buffer chip 20 may be mounted on the buffer chip substrate 10 using, for example, a flip-chip method due to the many input/output (I/O) terminals (i.e., bumps). The flip-chip method may also operate the buffer chip 20 at a high speed. The buffer chip 20 may be mounted on an upper surface of the buffer chip substrate 10 (FIG. 4A). Also, according to an alternative exemplary embodiment of the present invention, the buffer chip 20 may be mounted on a lower surface of the buffer chip substrate 10 (FIG. 4B). This may be because the number of the external connection terminals 30 of the buffered memory module package 400 according to the exemplary embodiment may be less than that of a conventional buffered package (refer to 310 in FIG. 2)

Figure 5:
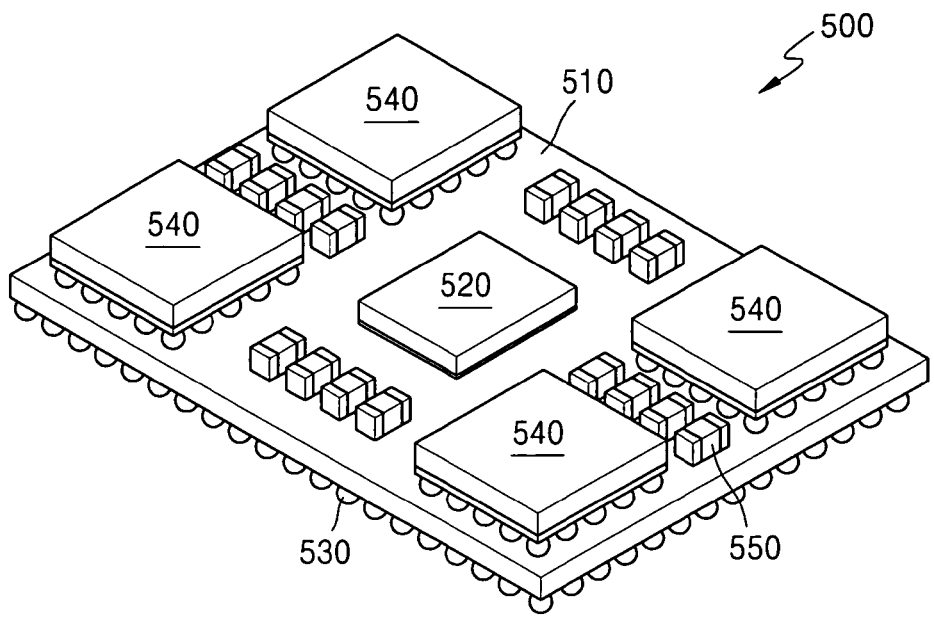
FIG. 5 is a perspective view illustrating an exemplary embodiment of a buffered DRAM module package according to the present invention.

FIG. 5 is a perspective view of a buffered memory module package 500 according to a first exemplary embodiment of the present invention.

Referring to FIG. 5, the buffered memory module package 500 may include a buffer chip substrate 510, a buffer chip 520, external connection terminals 530 for module, and memory packages 540. The buffered memory module package 500 may further include a plurality of decoupling capacitors 550.

It should be appreciated that the buffer chip substrate 510 may also be the substrate for the memory module because the buffer chip substrate 510 may also act as the substrate for the buffered memory module package 500.

Figure 6A:
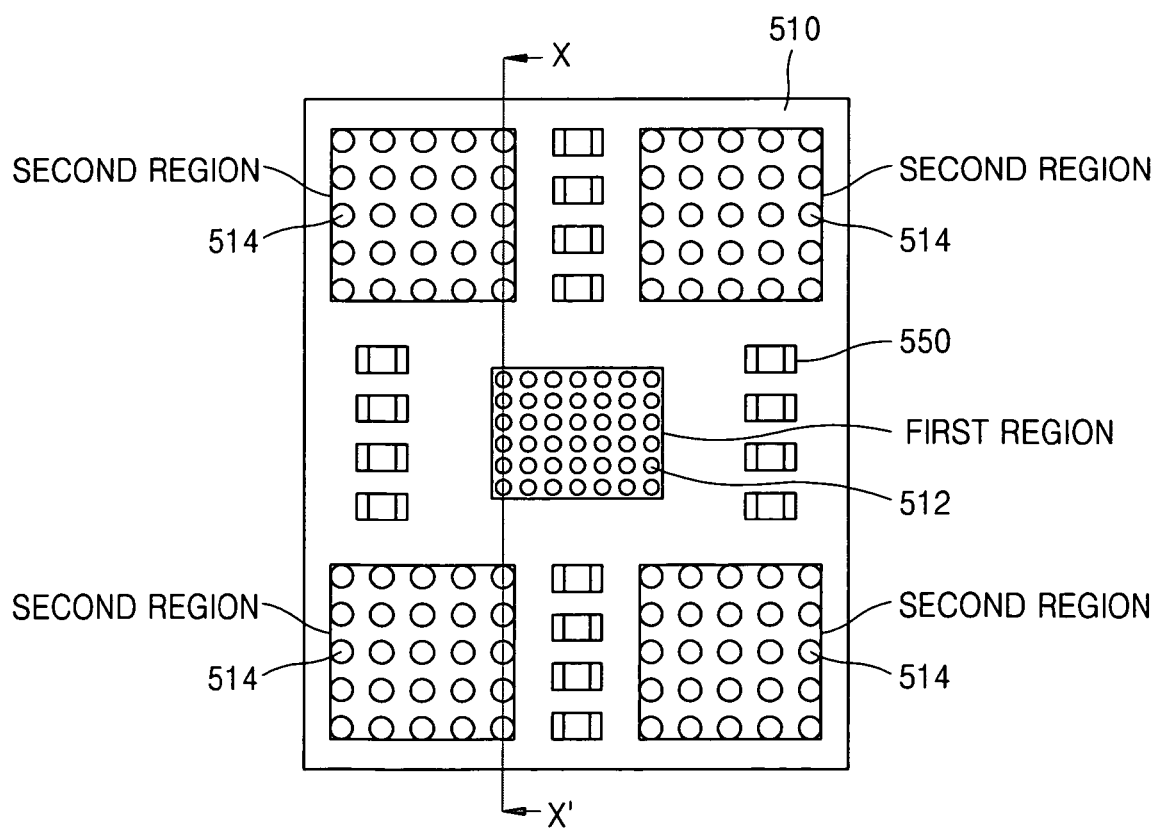
FIG. 6A is a plan view of an exemplary embodiment of a buffer chip substrate of the buffered DRAM module package of FIG. 5.
Figure 6B:
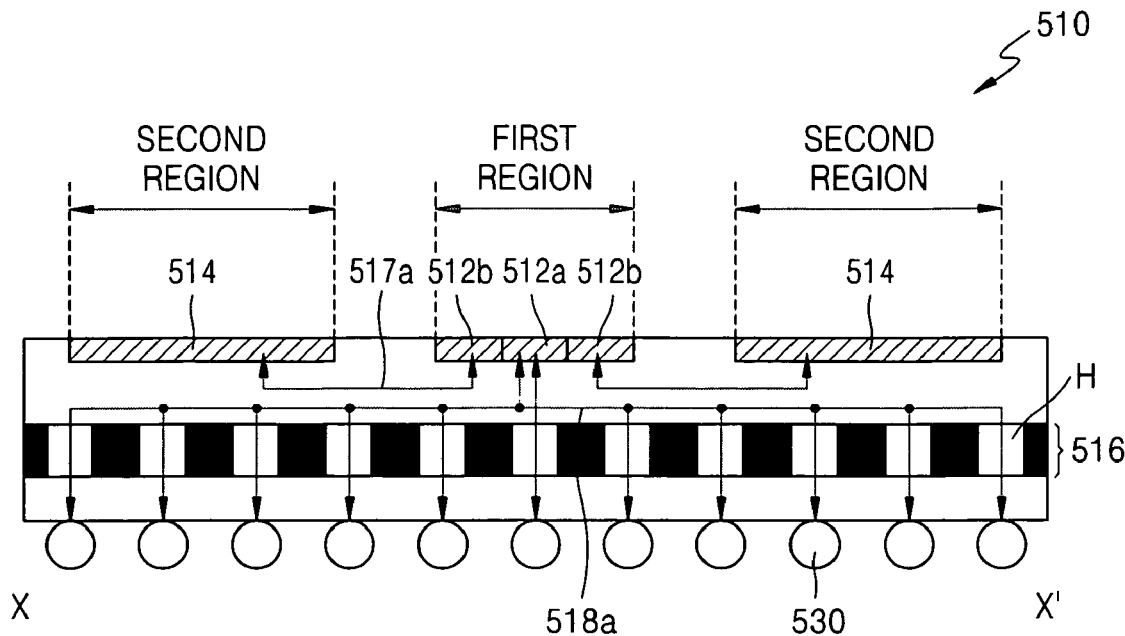
FIG. 6B is a cross-sectional view of an exemplary embodiment of the buffer chip substrate of the buffered DRAM module package of FIG. 5.

FIG. 6A is a plan view illustrating an exemplary embodiment of a buffer chip substrate 510 of the buffered DRAM module package of FIG. 5. FIG. 6B is a cross-sectional view taken along a line X-X' of FIG. 6A.

Referring to FIGS. 6A and 6B, the buffer chip substrate 510 may include buffer connection terminals 512 and a plurality of memory connection terminals 514 formed on an upper surface of the buffer chip substrate 510. The buffer connection terminals 512 may be arranged in a matrix on a first region of the buffer chip substrate 510, and the memory connection terminals 514 may be arranged in a matrix on a second region of the buffer chip substrate 510. The buffer connection terminals 512 may be electrically connected to the buffer chip 520 via I/O terminals of the buffer chip 520. The memory connection terminals 514 may be electrically connected to the memory chip via I/O terminals of the memory package.

A core layer 516 may be formed within the buffer chip substrate 510. The core layer 516 may support the buffer chip substrate 510 to prevent bending of the substrate. A plurality of through holes H may be formed in the core layer 516.

Further, metal wiring patterns 517 and 518 may be formed in the buffer chip substrate 510. The metal wiring patterns 517 and 518 may provide electrical connections in the buffered memory module package 500. The metal wiring patterns 517 and 518 may include memory connection wirings 517a and external connection wirings 518a.

The memory connection wirings 517a may electrically connect a portion 512b of the buffer connection terminals with the memory connection terminals 514. The external connection wirings 518a may electrically connect the remaining portion 512a of the buffer connection terminals with the external connection terminals 530. The external connection wirings 518a may pass through the through holes H of the core layer 516. However, the memory connection wirings 517a may not need to pass through the through holes H of the core layer 516 because the portion 512b of the buffer connection terminals and the memory connection terminals 514 may both be formed on an upper surface of the buffer chip substrate 510. In an alternative exemplary embodiment, the memory connection wirings 517a may pass through the through hole H of the core layer 516 if the buffer chip 520 is mounted on the lower surface of the buffer chip substrate 510.

According to an exemplary embodiment of the present invention, the number of the through holes H through the core layer 516 may be reduced because there may be fewer metal wiring patterns passing through the core layer in the present invention than in the conventional memory module packages. As a result, a build-up package having good electrical characteristics may be manufactured and the difficulty of manufacturing the buffer chip substrate 510 may be reduced.

Moreover, according to an alternative exemplary embodiment of the present invention, external connection terminals 530 for electrically connecting the memory connection terminals 514 with external devices may be unnecessary as opposed to conventional devices because the buffer connection terminal portion 512b and the memory connection terminals 514 may be electrically connected via the memory connection wirings 517a formed on the buffer chip substrate 510. Therefore, the number of external connection terminals 530 of the buffer chip substrate 510 in the exemplary embodiment of the present invention may be less than those of a conventional buffer chip substrate.

Referring to FIGS. 5, 6A, and 6B, the buffered memory module package 500 may include a plurality of memory packages 540. The memory packages 540 may be mounted on a second region of the buffer chip substrate 510. The memory packages 540 may include a single memory chip or a plurality of chips. There may be no specific limitations to the type, number, and shapes of the memory chips that may be included in the memory packages 540. For example, the memory packages 540 may be chip-stacks, wafer-stacks, or package-stacks so as to include a plurality of memory chips.

The buffered memory module package 500 may include a plurality of decoupling capacitors 550. The decoupling capacitors 550 may reduce the power delivery noise in a semiconductor device operating at high speed. The buffered memory module package 500 may not necessarily require a resistor because all devices communicate with a 1:1 ratio. However, the buffered memory module package 500 may require the decoupling capacitors 550 because the semiconductor device operates at a high speed. The decoupling capacitors 550 may be mounted on a surface of the buffer chip substrate 510. However, if the manufacturing of an embedded capacitor with a large capacity is possible, the decoupling capacitors 550 may be formed within the buffer chip substrate 510.

In the exemplary embodiment as depicted in FIGS. 5, 6A, and 6B, the buffer chip 520 of the buffered memory module package 500 may be mounted on a central region (the first region) of an upper surface of the buffer chip substrate 510, and the memory packages 540 of the buffered memory module package 500 may be mounted on four corners (the second region) of the buffer chip substrate 510. The decoupling capacitors 550 may be disposed in areas between the buffer chip 520 and the memory packages 540. However, the arrangement of the buffer chip 520, the memory packages 540, and the decoupling capacitors 550 may not be limited thereto, and may be arranged in many different arrays. Some exemplary embodiments of the arrangements are shown in FIGS. 7 through 10B.

Figure 7:
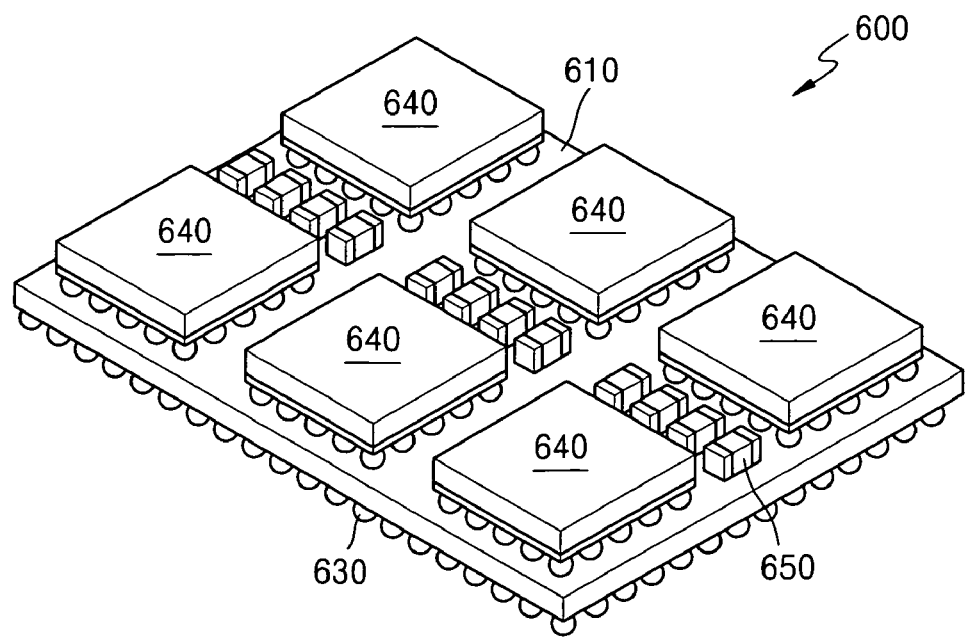
FIG. 7 is a perspective view of an exemplary embodiment of a buffered DRAM module package according to the present invention.

FIG. 7 is a perspective view of a buffered memory module package 600 according to a second exemplary embodiment of the present invention.

Referring to FIG. 7, the buffered memory module package 600 may include at least a buffer chip substrate 610, a buffer chip 620, external connection terminals 630 for a module, and a plurality of memory packages 640. The buffered memory module package 600 may further include a plurality of decoupling capacitors 650. In this exemplary embodiment, the buffer chip substrate 610 may also be the substrate for the buffered memory module package 600.

Figure 8A:
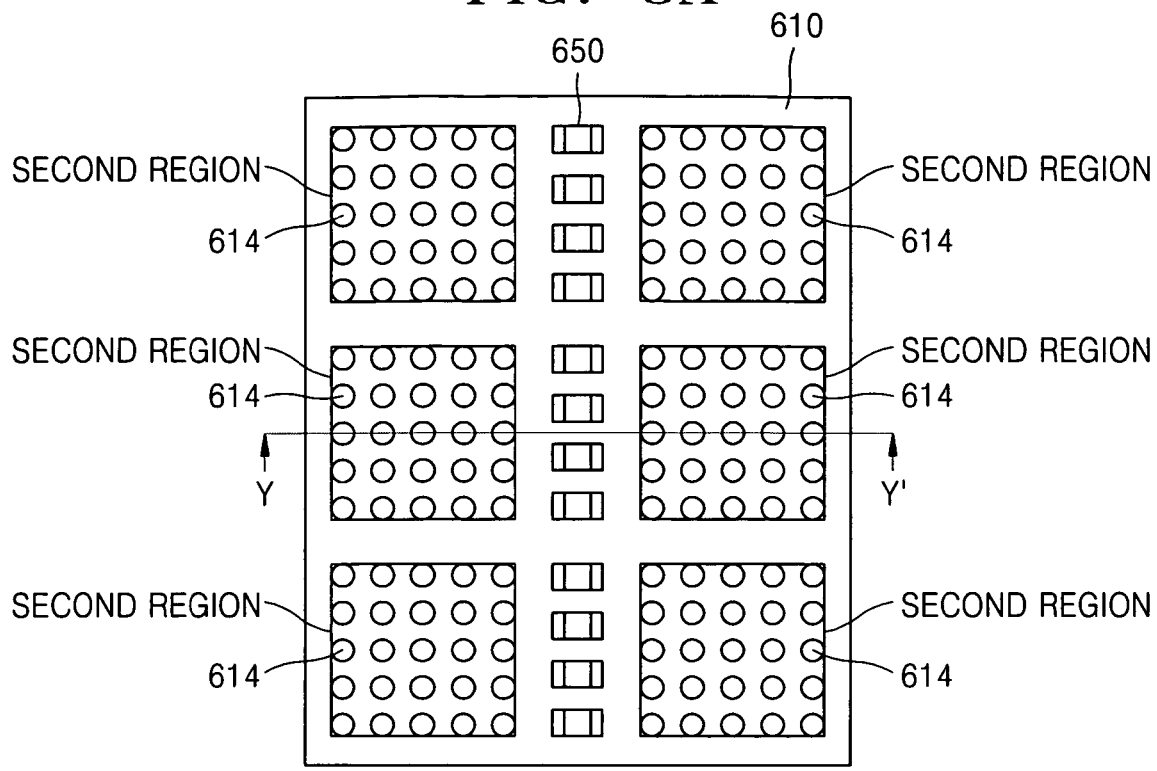
FIG. 8A is a plan view of an exemplary embodiment of a buffer chip substrate of the buffered DRAM module package of FIG. 7.
Figure 8B:
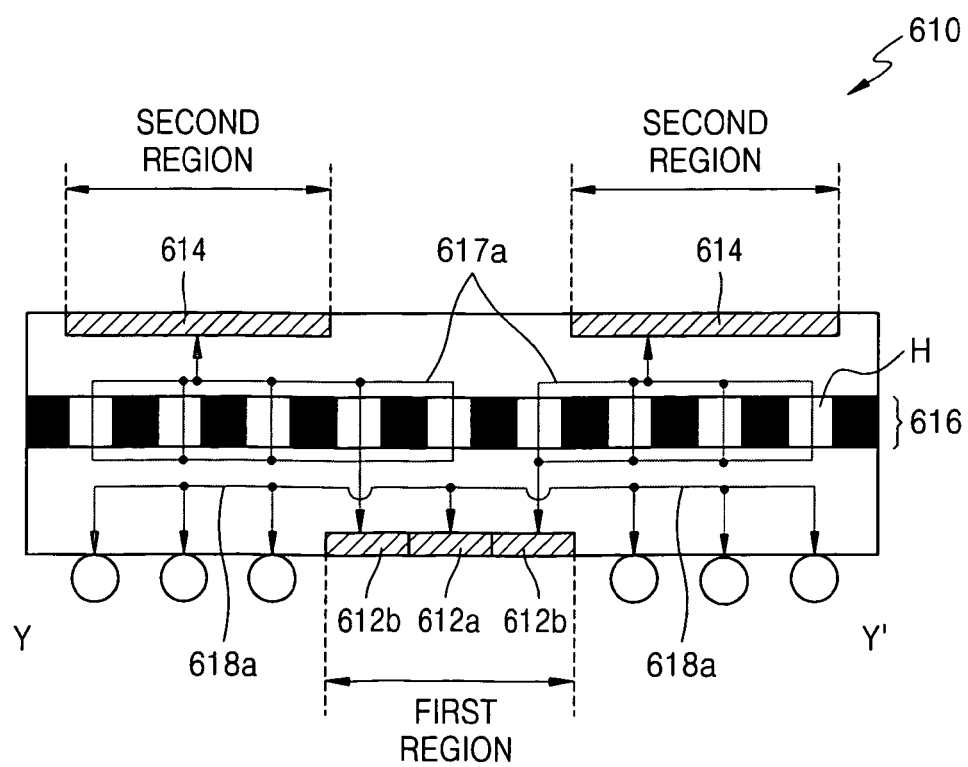
FIG. 8B is a cross-sectional view of an exemplary embodiment of the buffer chip substrate of the buffered DRAM module package of FIG. 8.

FIG. 8A is a plan view of an exemplary embodiment of the buffer chip substrate 610 of the buffered memory module package of FIG. 7. FIG. 8B is a cross-sectional view taken along a line Y-Y' of FIG. 8A.

Referring to FIGS. 8A and 8B, the buffer chip substrate 610 may include at least buffer connection terminals 612a and 612b formed on a lower surface of the buffer chip substrate 610 and a plurality of memory connection terminals 614 formed on an upper surface of the buffer chip substrate 610. The buffer connection terminals 612a and 612b may be arranged in a matrix on a first region of the buffer chip substrate 610, and the memory connection terminals 614 may be in a matrix on a second region of the buffer chip substrate 610. The buffer connection terminals 612a and 612b may be electrically connected to the buffer chip (not shown) via I/O terminals of the buffer chip. The memory connection terminals 614 may be electrically connected to the memory chips via I/O terminals of the memory package.

A core layer 616 may be formed in the buffer chip substrate 610. The core layer 616 may support the buffer chip substrate 610 to prevent bending of the substrate. A plurality of through holes H may be formed in the core layer 616.

Further, metal wiring patterns 617 and 618 for electrical connecting the buffered memory module package 600 to other components may be formed within the buffer chip substrate 610. The metal wiring patterns 617 and 618 may include the memory connection wirings 617a and external connection wirings 618a, respectively.

The memory connection wirings 617a may electrically connect a portion 612b of the buffer connection terminals with the memory connection terminals 614. The external connection wirings 618a may electrically connect the remaining portion 612a of the buffer connection terminals with the external connection terminals 630. The memory connection wirings 617a may pass through the through holes H of the core layer 616. However, the external connection terminals 618a may not need to pass the through holes H of the core layer 616 because both the portion 612b of the buffer connection terminals and the external connection terminals 630 may be formed on a lower surface of the buffer chip substrate 610. That is, the external connection terminals 618a may be formed only in the lower portion of the core layer 616 of the buffer chip substrate 610.

In an exemplary embodiment, there may be fewer through holes H in the core layer 616 than in the conventional device because the number of the metal patterns that pass through the core layer 616 may be reduced. As a result, a build-up package having good electrical characteristics may be manufactured, and the difficulty of manufacturing the buffer chip substrate 610 may be reduced.

Moreover, according to an exemplary embodiment, external connection terminals 618a for electrical connecting the memory connection terminals to the buffer chip substrate 610 may be unnecessary, as opposed to the conventional devices because the buffer connection terminals 612b and the external connection terminals 630 may be electrically connected via the external connection terminals 618 formed in the buffer chip substrate 610. Therefore, there may be fewer external connection terminals 630 of the buffer chip substrate 610 in the present invention than in the conventional devices.

Referring to FIGS. 7, 8A, and 8B, the buffered memory module package 600 may include at least a plurality of memory packages 640. The memory packages 640 may be mounted on a second region of the buffer chip substrate 610. The memory packages 640 may include a single memory chip or a plurality of chips. There may be no specific limitations to the type, number, and shapes of the memory chips that may be included in the memory packages 640. For example, the memory packages 640 may be chip-stacks, wafer-stacks, or package-stacks so as to include a plurality of memory chips. The buffered memory module package 600 may include a plurality of decoupling capacitors 650.

In the exemplary embodiment as depicted in FIGS. 7, 8A, and 8B, the buffer chip 620 (not shown) of the buffered memory module package 600 may be mounted on a central region (the first region) on a lower surface of the buffer chip substrate 610, and the memory packages 640 (not shown) of the buffered memory module package 600 may be mounted on the sides (second region) in two rows on an upper surface of the buffer chip substrate 610. It should be appreciated that three memory packages 640 may be included in a row on buffer chip substrate 610. The decoupling capacitors 650 may be disposed in an area between the buffer chip 620 and the memory packages 640.

Figure 9A:
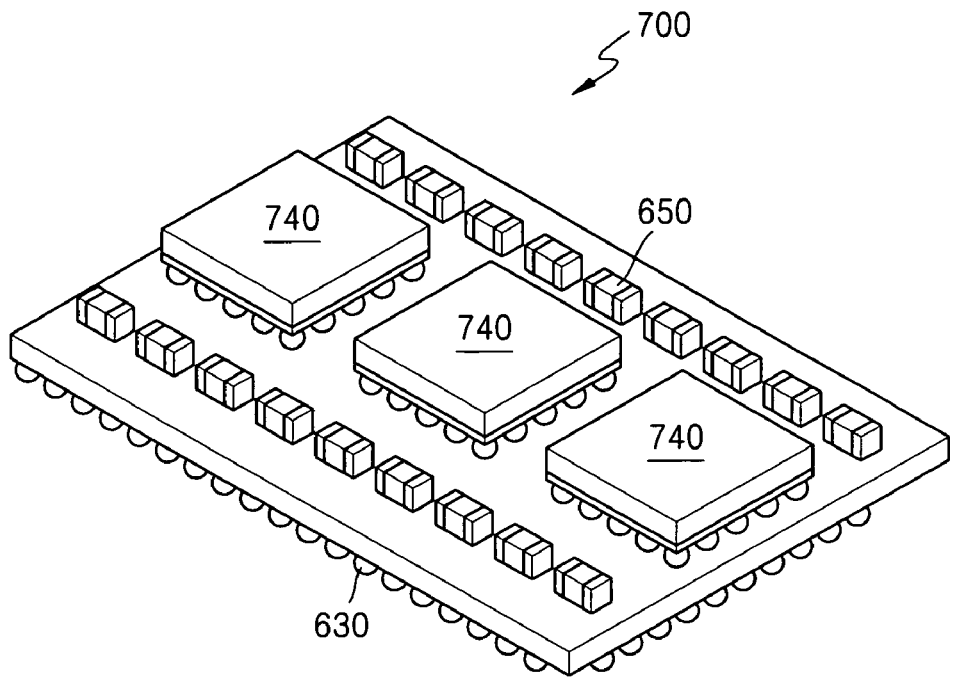
FIG. 9A is a perspective view of an exemplary embodiment of a buffered DRAM module package according to the present invention.
Figure 9B:
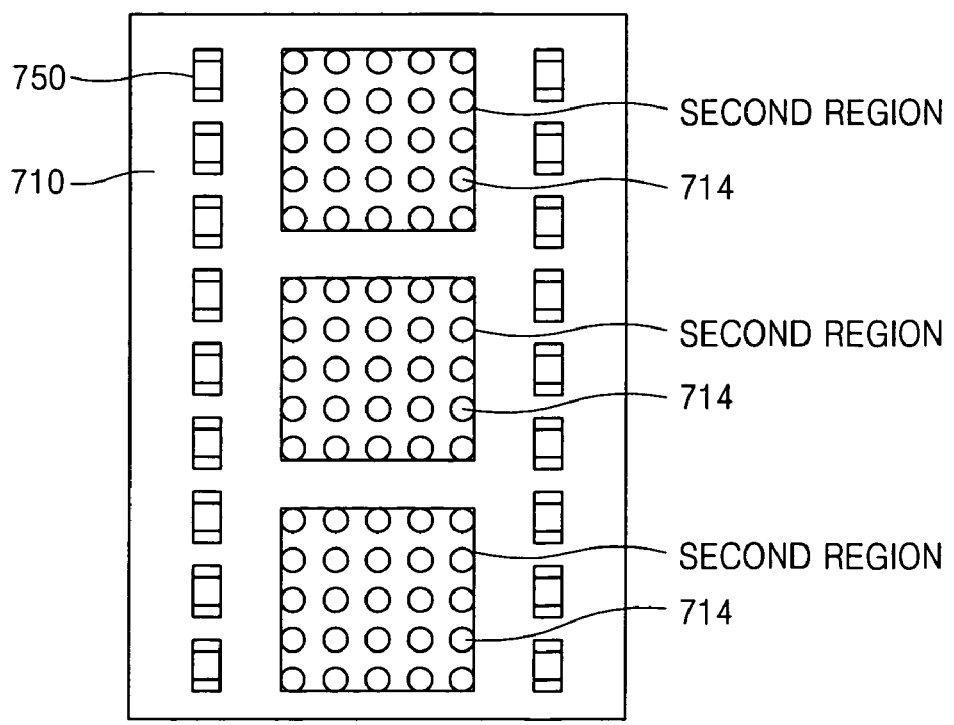
FIG. 9B is plan view of an exemplary embodiment of a buffer chip substrate of the buffered DRAM module package of FIG. 9A.

FIG. 9A is a perspective view of a buffered memory module package 700 according to a third exemplary embodiment of the present invention. FIG. 9B is plan view of a buffer chip substrate 710 of the buffered memory module package 700 of FIG. 9A.

Referring to FIGS. 9A and 9B, the buffered memory module package 700 may include at least a configuration of mounting the buffer chip (not shown) on a lower surface of the buffer chip substrate 710, as similarly shown in FIG. 4B. The memory packages 740 may be arranged in a single row on a central region (the first region) of an upper surface of the buffer chip substrate 710. Memory connection terminals 714 formed on the buffer chip substrate 710 may be arranged according to the arrangement of the memory packages 740. A plurality of decoupling capacitors 750 may be disposed on both sides of the memory packages 740. External connection terminals 730 of the buffered memory module package 700 may be disposed on a lower surface of the buffer chip substrate 710.

Figure 10A:
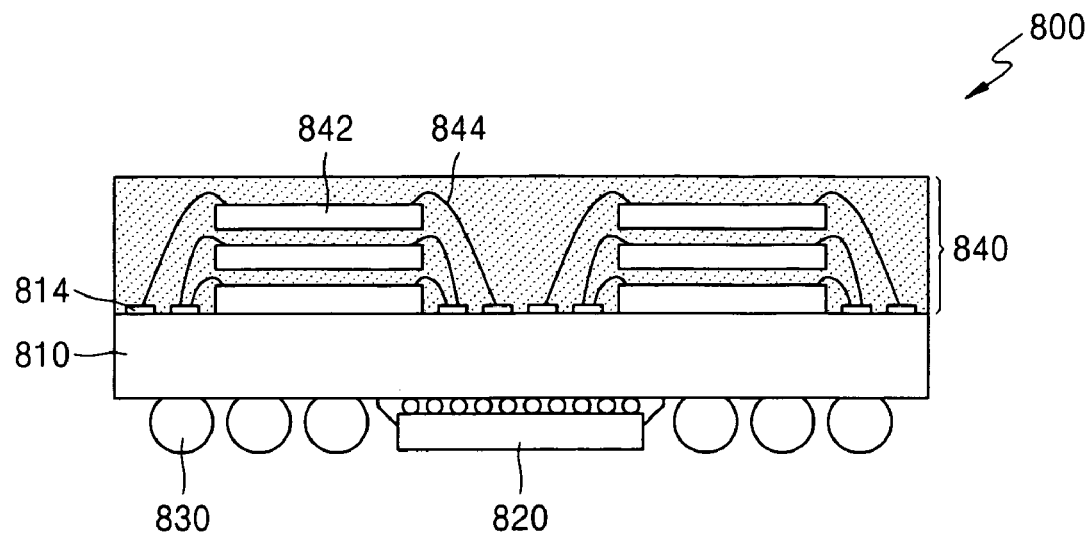
FIG. 10A is a cross-sectional view of an exemplary embodiment of a buffered DRAM module package according to the present invention.
Figure 10B:
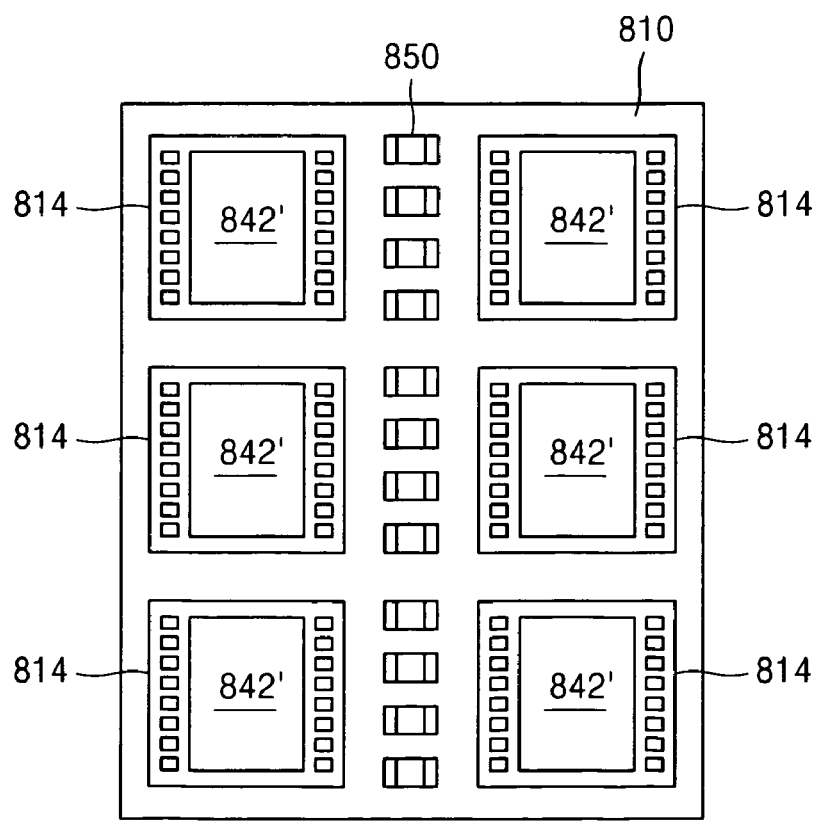
FIG. 10B is a plan view of an exemplary embodiment of a buffer chip substrate of the buffered DRAM module package of FIG. 10A.

FIG. 10A is a cross-sectional view of a buffered memory module package 800 according to a fourth exemplary embodiment of the present invention. FIG. 10B is a plan view of a buffer chip substrate 810 of the buffered memory module package 800 of FIG. 10A.

Referring to FIGS. 10A and 10B, the buffered memory module package 800 may include a buffer chip 820 mounted on a lower surface of the buffer chip substrate 810, as similarly shown in FIG. 4B, and the external connection terminals 830 may be arranged around the buffer chip 820. Memory packages 840 may be mounted on an upper surface of the buffer chip substrate 810. A plurality of memory chips 842 included in the memory packages 840 may be arranged in two rows on the upper surface of the buffer chip substrate 810. It should be appreciated that the memory chips 842 may be a single chip or a stacked chip, for example, but not limited to, 2-4 stacked chips.

It should also be understood that the arrangement of the memory chips 842 in the exemplary embodiment of FIGS. 10A and 10B may be the same as the arrangement of the memory packages 640 in FIGS. 8A and 8B. However, the memory packages 640 in FIGS. 8A and 8B may be molded into an individual package while all of the memory chips 842 of the exemplary embodiment of FIGS. 10A and 10B may be molded into a single package.

Another difference of the exemplary embodiment of FIGS. 10A and 10B from the exemplary embodiments of FIGS. 8A and 8B may be that the bonding pads of each of the memory chips 842 may be directly electrically connected to the memory connection terminals 814 of the buffer chip substrate 810 by wires 844. That is, the buffer chip substrate 810 may act as the substrate of the memory packages 840. Accordingly, the memory connection terminals 814 of the buffer chip substrate 810 may not be disposed in a matrix but located along two opposite sides of regions 842' where memory chips 842 may be mounted. Further, a plurality of decoupling capacitors 850 may be interposed between the rows of the memory chips 842.

As described in the first through fourth exemplary embodiments, the buffered memory module package may have a variety of arrangements based on the location of buffer chips mounted on the buffer chip substrate, the number of memory chips included in the memory packages and/or the number of chips for ECC, configuration of the system board where the buffered memory module package may be mounted, and the usage of the buffered memory module. However, it should be fully appreciated that other arrangements of the buffered memory module package may be implemented beside the ones described in the above exemplary embodiments.

A buffered memory module stack package (hereinafter, a module stack package) according to a fifth exemplary embodiment of the present invention will now be described. The module stack package may be a package that may include more than two buffered memory module packages. However, it should be understood that the structure and arrangement of the external connection terminals of the module stack package may be different from the first through fourth exemplary embodiments. For example, the arrangement of the external connection wirings that may electrically connect the external connection terminals with the buffer chips may be different.

FIG. 11 is a schematic drawing illustrating an exemplary embodiment of a configuration of a module stack package including two buffered memory module packages, according to the present invention.

Referring to FIG. 11, the module stack package may include at least a first buffered memory module package 900 and a second buffered memory module package 900'. The first and second buffered memory module packages 900 and 900' respectively may include buffer packages and memory packages 940 and 940'. The buffer packages respectively may include buffer chips (not shown), buffer chip substrates 910 and 910', first external connection terminals 931 and 931', and second external terminals 932 and 932'.

In the exemplary embodiment, the first external connection terminals 931 of the first buffered memory module package 900 may be configured to be electrically connected to an IC chipset via a system board. The first external connection terminals 931' of the second buffered memory module package 900' may be electrically connected to the second external connection terminals 932 of the first buffered memory module package 900. Accordingly, as an exemplary embodiment, the first external connection terminals 931 and 931' may be pins, and the second external connection terminals 932 and 932' may be sockets. However, it should be appreciated that the first external connection terminals 931 and 931' may be sockets, and the second external connection terminals 932 and 932' may be pins, or any combination thereof. It should further be appreciated that other types of external connection terminals may be used besides the pin and socket connectors.

Figure 12A:
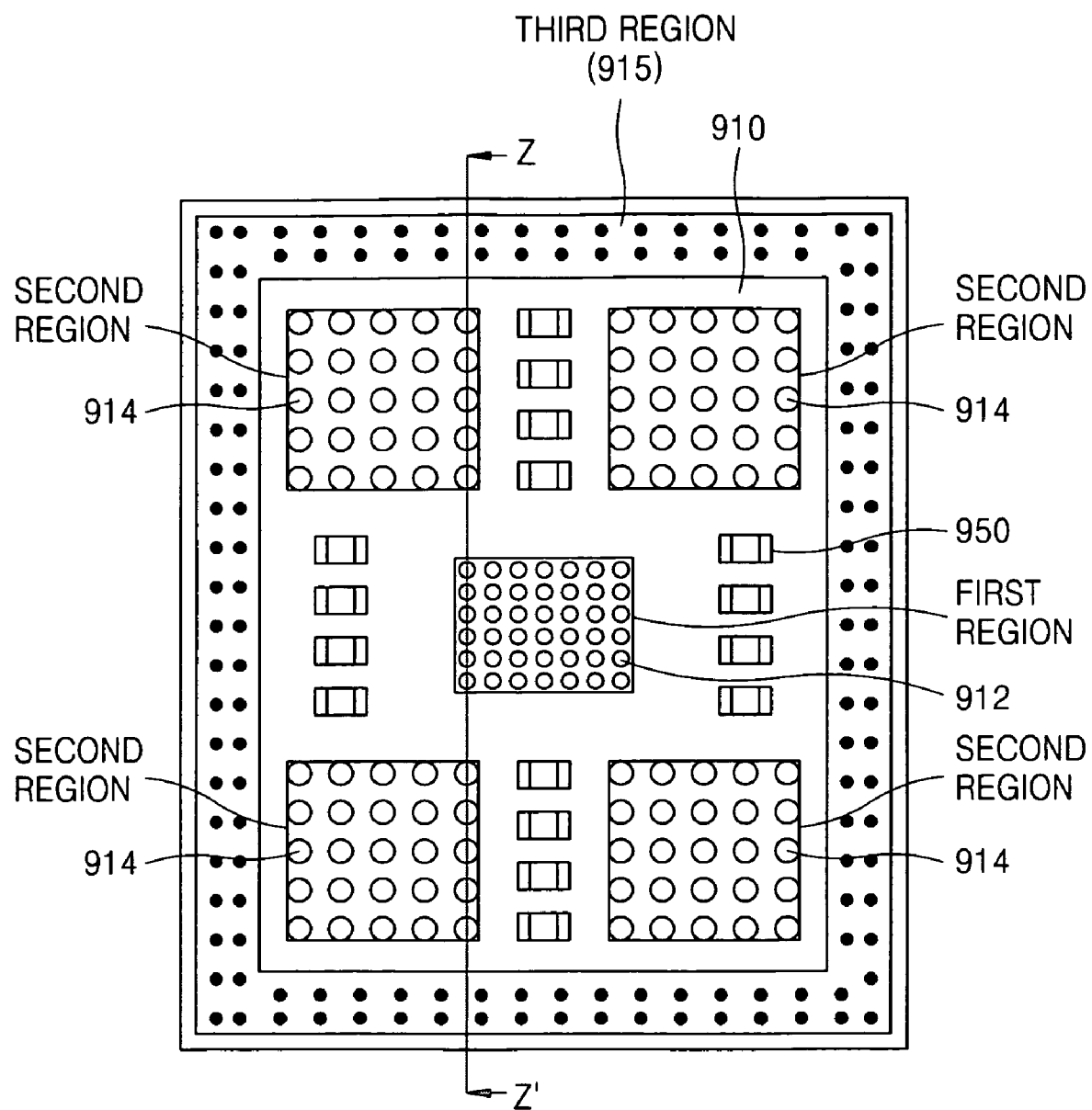
FIG. 12A is a plan view of an exemplary embodiment of a buffer chip substrate of a buffered DRAM module stack package according to the present invention.
Figure 12B:
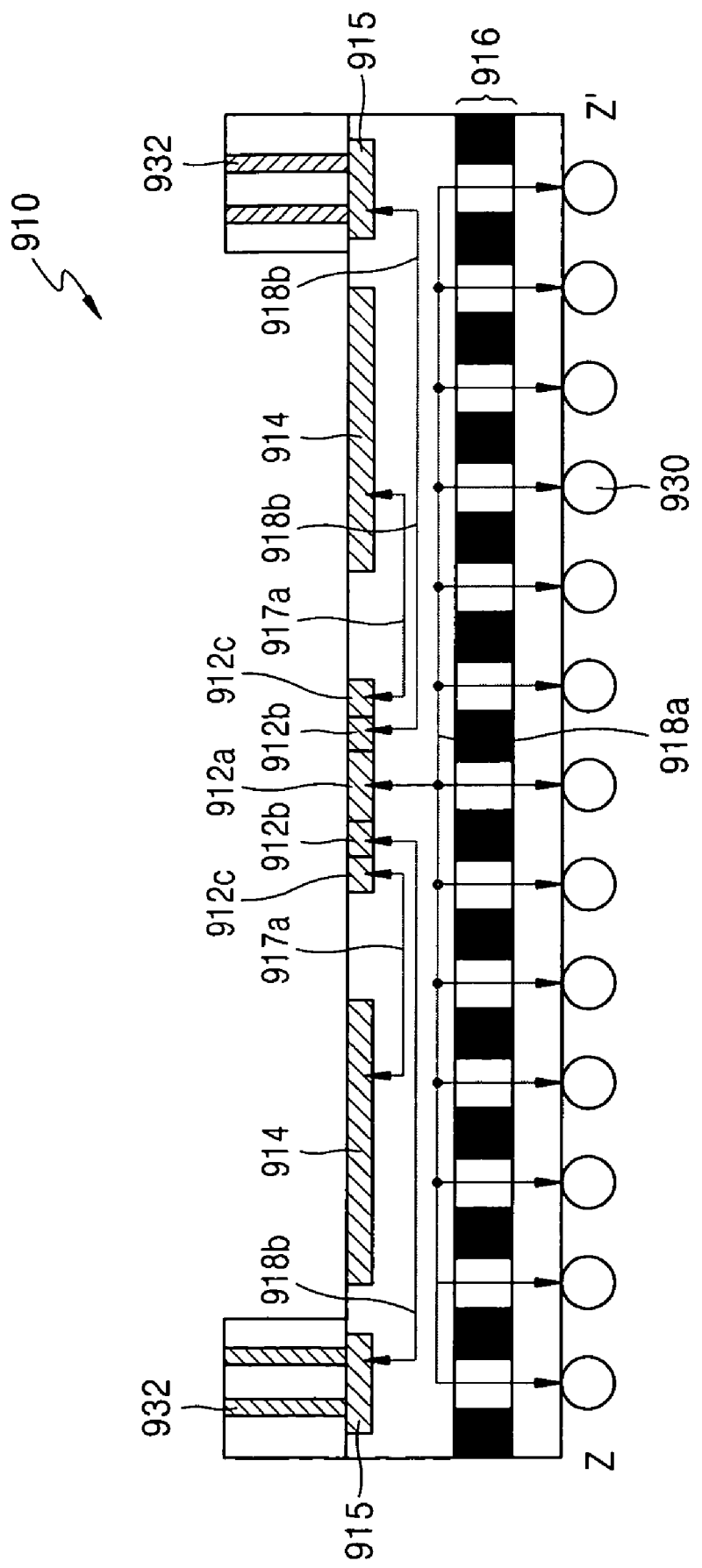
FIG. 12B is a cross-sectional view of an exemplary embodiment of a buffer chip substrate of a buffered DRAM module stack package taken along a line Z-Z' of FIG. 12A.

FIG. 12A is a plan view of a buffer chip substrate 910 of a module stack package according to a fifth exemplary embodiment of the present invention. FIG. 12B is a cross-sectional view taken along a line Z-Z' of FIG. 12A.

The buffer chip substrate 910 depicted in FIGS. 12A and 12B may be a modified version of the buffer chip substrate 510 shown in FIGS. 6A and 6B. It should also be appreciated that the buffer chip substrates according to the second through fourth embodiments may be modified using the same principles.

Referring to FIGS. 12A and 12B, the buffer chip substrate 910 may include at least buffer connection terminals 912, a plurality of memory connection terminals 914, and wire connection pads 915 on an upper surface of the buffer chip substrate 910. The buffer connection terminals 912 may be arranged in a matrix on a first region of the buffer chip substrate 910. The memory connection terminals 914 may be arranged in a matrix on a second region of the buffer chip substrate 910. The buffer connection terminals 912 may be electrically connected to the buffer chip (not shown) via I/O terminals of the buffer chip. The memory connection terminals 914 may be electrically connected to the memory chips through I/O terminals of the memory package. The wire connection pads 915 may be disposed on a third region along edges of the buffer chip substrate 910. The wire connection pads 915 may be disposed on the four edges of the buffer chip substrate 910 in FIG. 12A, however, the wire connection pads 915 may also be located on both edges of the buffer chip substrate 910 corresponding to the first external connection terminals 931'. The wire connection pads 915 may be electrically connected to the second external connection terminals 932.

A core layer 916 may be formed in the buffer chip substrate 910. The core layer 916 may support the buffer chip substrate 910 to prevent bending of the substrate. A plurality of through holes H may be formed in the core layer 916.

Further, metal wiring patterns 917, 918a, and 918b may be formed within the buffer chip substrate 910. The metal wiring patterns 917, 918a, and 918b may be formed for electrically connecting the buffered memory module package 900 with external devices. The metal wiring patterns 917, 918a, and 918b may include memory connection wirings 917a and first and second external connection wirings 918a and 918b, respectively.

The memory connection wirings 917a may electrically connect a portion 912b of the buffer connection terminals with the memory connection terminals 914. The first external connection wirings 918a may electrically connect another portion 912a of the buffer connection terminals to the first external connection terminals 930. The first external connection terminals 530 depicted in FIG. 12B may not be practically seen in a cross-sectional view taken a line Z-Z' except the terminals on both edges, but they are depicted in FIG. 12B for convenience of concept transference. The second external connection wirings 918b may electrically connect the remaining portion 912c of the buffer connection terminals with the wire connection pads 915. The first external connection wirings 918a may pass through the through holes H of the core layer 916. However, the memory connection wiring 917a and the second external connection wirings 918b may not need to pass through the through holes H because a portion of the buffer connection terminals 912b and 912c, the memory connection terminals 914, and the wire connection pads 915 may all be formed on an upper surface of the buffer chip substrate 910. That is, the memory connection wirings 917a and the second external connection wirings 918b may be formed in the upper portion of the buffer chip substrate 910 over core layer 916.

The buffered memory module packages 900 and 900' described above may each have a height of, for example, but not limited to, about 1 cm, which may result in reducing the size of the module stack package. Accordingly, the exemplary embodiment of the buffered memory module package 900 in FIG. 11 may be possible to manufacture the pin type first external connection terminals 931 with a length $h_2$, smaller than approximately 1 mm, and the socket typed second external connection terminals 932 with a height $h_4$ less than approximately 1 cm. A thickness $h_3$ of the buffer chip substrate 910 may be approximately 1 mm. Accordingly, the overall height of the buffered memory module package 900 may be mainly determined by the height $h_4$ of the socket, which may be about 1 cm. Therefore, the height of a module stack package that may include the two buffered memory module packages 900 and 900' may be only about 2 cm.

Figure 13:
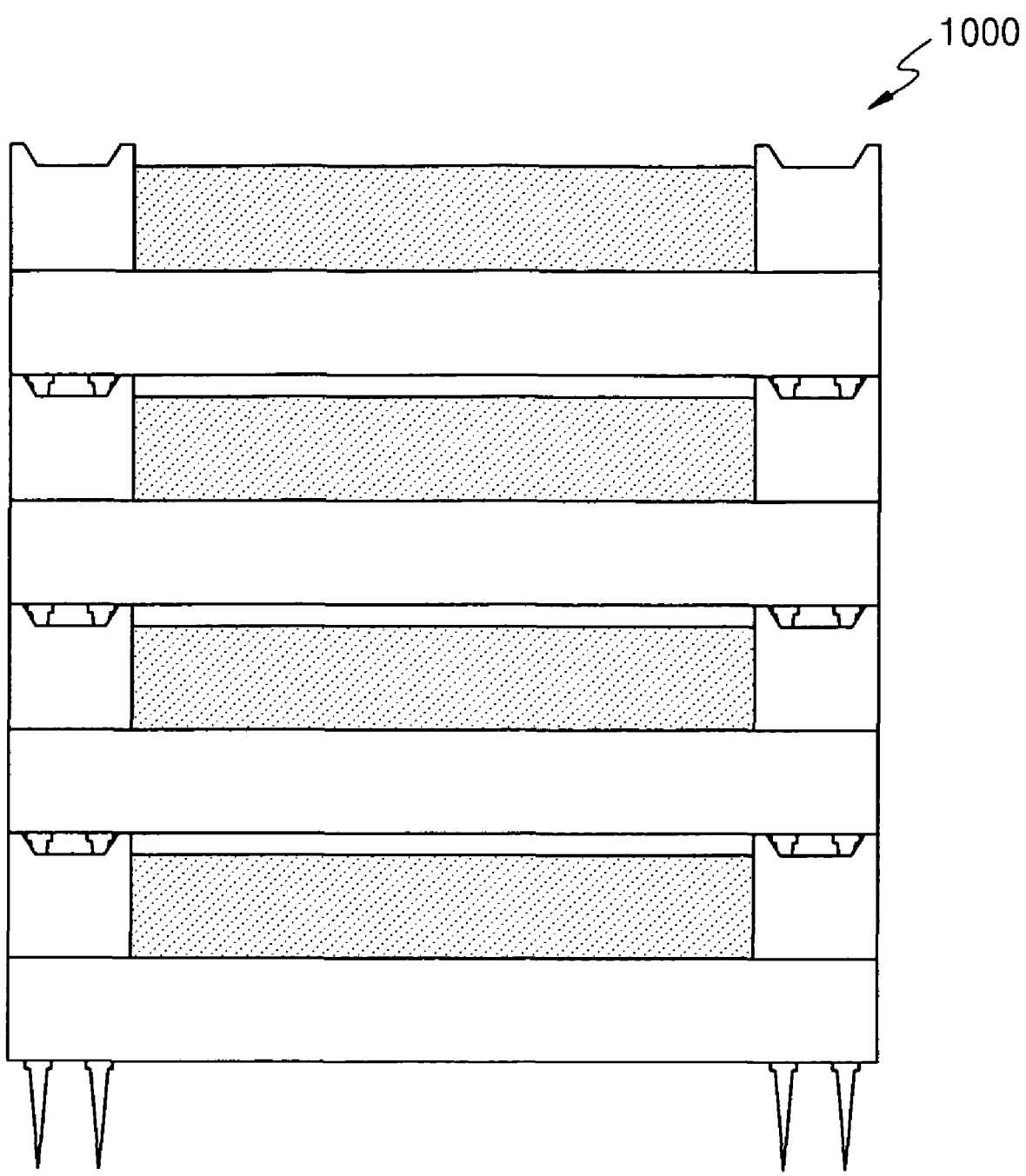
FIG. 13 is a side view of an exemplary embodiment of a buffered DRAM module stack package composed of four buffered DRAM module packages according to the present invention.

FIG. 13 is a side view of a module stack package 1000 according to a sixth exemplary embodiment of the present invention. The module stack package 1000 may include four buffered memory module packages. In this case, the overall height of the module stack package 1000 may be about 4 cm. The length and width of the buffer chip substrate may be determined by the size of the buffer chip substrate, and the vertical length of the buffer chip substrate may be significantly less than the length $l_1$ of the buffered memory module package 300 depicted in FIG. 2. Moreover, the width of the buffer chip substrate may not be greater than the width of the conventional buffered memory module package 300 depicted in FIG. 2 because the four buffered memory module packages 300 may have to be mounted on a system board with a predetermined space between them. Therefore, the module stack package 1000 according to the exemplary embodiment may be mounted in a miniaturized computer because the area that the module stack package occupies may be reduced.

As described above, in the exemplary embodiments of the buffered memory module package according to the present invention, the buffer chip substrate may act as the substrate for the entire memory module package. Therefore, material costs for the substrates and manufacturing costs may be reduced because the substrate for the buffer and the substrate for the memory module may not be separated.

In exemplary embodiments of the buffered memory module package according to the present invention, the length of wirings between the memory packages and the buffer chip may not vary with respect to the location of the memory packages because the memory packages may be disposed around the buffer chip. This permits manufacturing buffered memory module packages with shorter wirings, which may generate good electrical characteristics in the wirings.

According to the exemplary embodiments of the present invention, the number of external connection terminals of the buffer chip substrate may be reduced. Further, the density of the metal wiring patterns may also be reduced that connect an upper and a lower buffer chip substrate. Accordingly, the electrical reliability of a buffered memory module package that uses a build-up package substrate may be increased, and the difficulty in manufacturing a process of the build-up package substrate may be reduced.

Further, exemplary embodiments of the present invention may provide manufacturing a module stack package with a reduced size that includes a plurality of buffered memory module packages because a small sized buffered memory module package may be manufactured while easily expanding the capacity of the memory. Thus, the overall size of a computer system that includes a module stack package may be reduced and the configuration efficiency of the system board may be improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device, comprising:
   a buffer chip package that includes a buffer chip that acts as a memory buffer mounted on a buffer substrate, the buffer chip package including a plurality of external connection terminals; and
   at least one memory package mounted on the buffer chip substrate, the at least one memory package including a plurality of memory chips.

2. The semiconductor device of claim 1, wherein the external connection terminals are connected to a system board by one of solder balls and pins.

3. The semiconductor device of claim 2, wherein the pins are connected by one of a ball grid array package and a pin grid array package.

4. The semiconductor device of claim 1, wherein the buffer chip is mounted on a same surface of the buffer chip substrate on a surface where the external connection terminals are disposed.

5. The semiconductor device of claim 1, wherein the buffer chip is mounted on a surface of the buffer chip substrate opposite from a surface on which the external connection terminals are disposed.

6. A semiconductor device, comprising:
   a buffer chip substrate including buffer connection terminals and memory connection terminals;
   a buffer chip that acts as a memory buffer mounted on the buffer chip substrate and electrically connected to the buffer connection terminals;
   a plurality of memory packages mounted on the buffer chip substrate and electrically connected to the memory connection terminals; and
   a plurality of external connection terminals formed on a lower surface of the buffer chip substrate.

7. The semiconductor device of claim 6, wherein the external connection terminals are connected to a system board by one of solder balls and pins.

8. The semiconductor device of claim 7, wherein the pins are connected by one of a ball grid array and a pin grid array.

9. The semiconductor device of claim 6, wherein the plurality of memory packages are mounted on an upper surface of the buffer chip substrate.

10. The semiconductor device of claim 6, wherein the buffer chip is mounted on one of an upper surface of the buffer chip substrate and a lower surface of the buffer chip substrate.

11. The semiconductor device of claim 9, wherein each of the memory packages is one of a single chip package and a chip-stacked package.

12. The semiconductor device of claim 6, wherein the buffer chip is a flip-chip type.

13. The semiconductor device of claim 6, further comprising a plurality of decoupling capacitors disposed on the buffer chip substrate.

14. The semiconductor device of claim 6, wherein the buffer chip substrate comprises:
   a plurality of memory connection wirings that electrically connect a portion of the buffer connection terminals with the memory connection terminals; and
   a plurality of external connection wirings that electrically connect the remaining portion of the buffer connection terminals with the external connection terminals of the memory module.

15. The semiconductor device of claim 14, wherein the memory connection wirings are formed on an upper surface of the buffer chip substrate.

16. The semiconductor device of claim 15, wherein the buffer chip substrate is a build-up substrate that includes a core layer in which a plurality of through holes are formed, and the external connection wirings pass through the core layer and the memory connection wirings do not pass through the core layer.

17. The semiconductor device of claim 14, wherein the external connection wirings are formed on a lower surface of the buffer chip substrate.

18. The semiconductor device of claim 17, wherein the buffer chip substrate is a build-up substrate that includes a core layer in which a plurality of through holes are formed, and the memory connection wirings pass through the core layer and the external connection wirings do not pass through the core layer.

19. A semiconductor device, comprising:

a first buffered memory module package; and a second buffered memory module package stacked on the first buffered memory module package, wherein each of the first and second buffered memory module packages includes:

a buffer chip substrate including buffer connection terminals, memory connection terminals, and wire connection pads;

a buffer chip that acts as a memory buffer mounted on the buffer chip substrate so as to be electrically connected to the memory connection terminals;

a plurality of memory packages mounted on the buffer chip substrate so as to be electrically connected to the memory connection terminals;

a plurality of first external connection terminals formed on a lower surface of the buffer chip substrate; and a plurality of second external connection terminals formed on an upper surface of the buffer chip substrate so as to be electrically connected to the wire connection pads.

20. A method for fabricating a semiconductor device, comprising:

mounting a buffer chip package on a buffer chip substrate, the buffer chip package including a buffer chip that acts as a memory buffer;

mounting at least one memory package on the buffer chip substrate, the at least one memory package including a plurality of memory chips; and connecting a plurality of external connection terminals on the buffer chip substrate.

* * * * *